United States Patent [19]

Shinbori et al.

[11] Patent Number: 4,594,613

[45] Date of Patent: Jun. 10, 1986

[54] SOLID-STATE IMAGING DEVICE ASSEMBLY

[75] Inventors: Kenichi Shinbori; Kazuo Ishikawa, both of Yokohama, Japan

[73] Assignee: Canon Kabushiki Kaisha, Tokyo, Japan

[21] Appl. No.: 464,576

[22] Filed: Feb. 7, 1983

[30] Foreign Application Priority Data

Feb. 16, 1982 [JP] Japan .................................. 57-23171

[51] Int. Cl.⁴ ............................................. H04N 3/14
[52] U.S. Cl. .................................... 358/213; 358/209; 250/578
[58] Field of Search ............... 358/213, 212, 209, 229, 358/225, 294; 361/421, 401, 420, 417, 419; 174/52 FP; 357/74, 79; 250/578, 204, 239

[56] References Cited

U.S. PATENT DOCUMENTS

| 4,266,090 | 5/1981 | Scherer | 174/52 FP |
| 4,404,582 | 9/1983 | Pollard et al. | 357/79 |
| 4,412,093 | 11/1983 | Wildeboer | 174/52 FP |
| 4,427,991 | 1/1984 | Yamamura et al. | 357/74 |
| 4,442,456 | 10/1984 | Iwata et al. | 358/213 |
| 4,457,017 | 6/1984 | Onogi et al. | 382/65 |

FOREIGN PATENT DOCUMENTS

0159677 12/1980 Japan .................................. 358/213

Primary Examiner—Gene Z. Rubinson
Assistant Examiner—Robert G. Lev
Attorney, Agent, or Firm—Fitzpatrick, Cella, Harper & Scinto

[57] ABSTRACT

A solid-state imaging device assembly is disclosed, comprising a solid-state imaging device; a metal member provided with first means for positioning the solid-state imaging device and second means for positioning the assembly on an apparatus utilizing the assembly; and an insulating frame for sealing the solid-state imaging device together with the metal member in a state in which the solid-state imaging device is positioned with respect to the metal member by the first positioning means of the metal member.

19 Claims, 11 Drawing Figures

SOLID-STATE IMAGING DEVICE ASSEMBLY

BACKGROUND OF THE INVENTION

1. Field of the Invention

The present invention relates to a solid-state imaging device assembly, and more particularly to a structure of a support or a package for such solid-state imaging device providing an assembly adapted for precision mounting on a camera body or a lens tube.

2. Description of the Prior Art

For the solid-state imaging device assembly of the above-mentioned sort there have been for example proposed following structures:

1. a structure in which the solid-state imaging device is fixed to a support member therefor without any positional definition, and the positional adjustment of the solid-state imaging device is achieved by an adjusting mechanism provided in the camera body or in the lens tube at the mounting of said support member on said camera body or lens tube;
2. a structure in which the solid-state imaging device is adhered to a support member therefor with positional adjustment therebetween through an optical alignment; and
3. a structure in which a reference end face is formed in a part of a multi-layered ceramic member constituting the support member for the solid-state imaging device and said solid-state imaging device is maintained in contact with said reference end face at mounting on said support member.

Such known structures are however associated with the following drawbacks:

A. The first structure requires an adjusting mechanism on the camera body or on the lens tube, and the relatively complex structure involved is a disadvantage with regard to weight reduction for, e.g., a camera and will necessitate a cumbersome adjustment procedure.
B. The second structure requires an extremely cumbersome and time-consuming adhesion procedure with frequent errors in the mounting since the relative positional relationship between the solid-state imaging device and the support member therefor has to be confirmed for example under a microscope at the mounting.
C. In the third structure, the dimensional precision of the multi-layered ceramic support member cannot be reduced beyond several tens of micrometers for example because of fluctuations in the shrinkage that occurs upon sintering, since such support member is prepared by punching a so-called green sheet, then laminating the thus punched sheets and sintering such laminated structure. For this reason a sufficient mounting precision cannot be obtained even when the solid-state imaging device is pressed against a reference end face formed in a part of such ceramic support member.

SUMMARY OF THE INVENTION

In consideration of the foregoing, an object of the present invention is to provide a novel solid-state imaging device assembly capable of avoiding the drawbacks inherent to the conventional structures.

Another object of the present invention is to provide a novel solid-state imaging device assembly capable of achieving an extremely high positional precision between the solid-state imaging device and the support member therefor.

Still another object of the present invention is to provide a novel solid-state imaging device assembly allowing elimination of a complex and bulky adjusting mechanism for example in a camera utilizing such assembly thereby enabling the manufacturer to reduce the dimension and weight of such camera.

Still another object of the present invention is to provide a solid-state imaging device assembly allowing simplification of the assembling procedure and reduction of the time required therefor, while maintaining stable reliability.

Still another object of the present invention is to provide a novel solid-state imaging device assembly capable of ensuring sufficient mounting precision, being inexpensive in cost and suited for mass production.

The foregoing objects can be achieved in a preferred embodiment, as will be explained in the following, by a solid-state imaging device assembly comprising: a solid-state imaging device; a metal member provided with first position defining means for positioning said solid-state imaging device and with second position defining means for positioning said assembly at the mounting thereof in an apparatus utilizing said assembly; and an insulating frame member for sealing said solid-state imaging device together with said metal member in a state in which said solid-state imaging device is placed in a position defined relative to said metal member by said first positioning means thereof.

Still other objects and features of the present invention will become fully apparent from the following description to be taken in conjunction with the attached drawings.

DESCRIPTION OF THE PREFERRED EMBODIMENTS

For facilitating the understanding of the present invention, there will be at first explained conventional structures.

Figure 1:
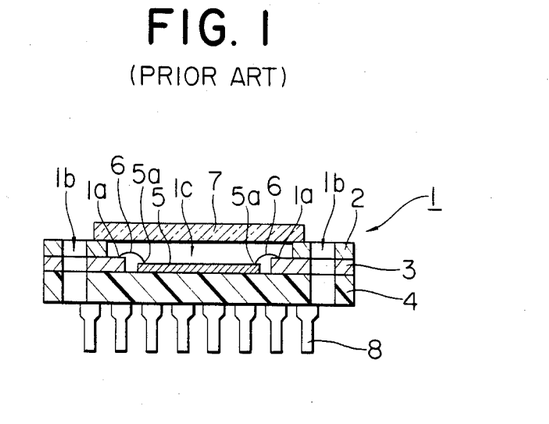
FIG. 1 is a cross-sectional view of a conventional solid-state imaging device assembly.
Figure 2:
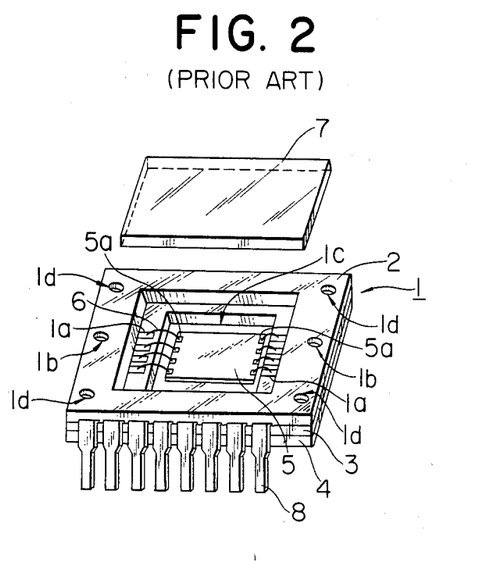
FIG. 2 is a partially disassembled perspective view of the assembly shown in FIG. 1.

FIGS. 1 and 2 show a typical conventional structure, wherein are shown ceramic layers 2, 3 and 4 constituting a multi-layered support member or a package 1 for a solid-state imaging device 5 which is fixed on the bottom of a chamber 1c provided in said support member 1. There are also shown bonding wires 6 for electrically connecting electrodes 5a of the device 5 with electrodes 1a of the support member 1; a glass plate 7 for sealing the chamber 1c of the support member 1 and protecting the device 5; terminal leads 8 connected to the electrodes 1a of the support member 1 and sandwiched between the ceramic layers 2 and 3 at the formation of the support member 1; holes 1b for positioning at the mounting of the assembly on a part of a device such as a camera; and fixing holes 1d for fixing the device, for example with screws.

In such conventional structure, the solid-state imaging device 5 is fixed on the bottom of the chamber 1c of the support member 1 either without any definite positioning as explained in the foregoing as the first conventional structure, or with positional adjustment for example under a microscope as explained in the foregoing as the second conventional structure. Such structures are however associated with drawbacks as respectively explained under items A and B above.

Figure 3:
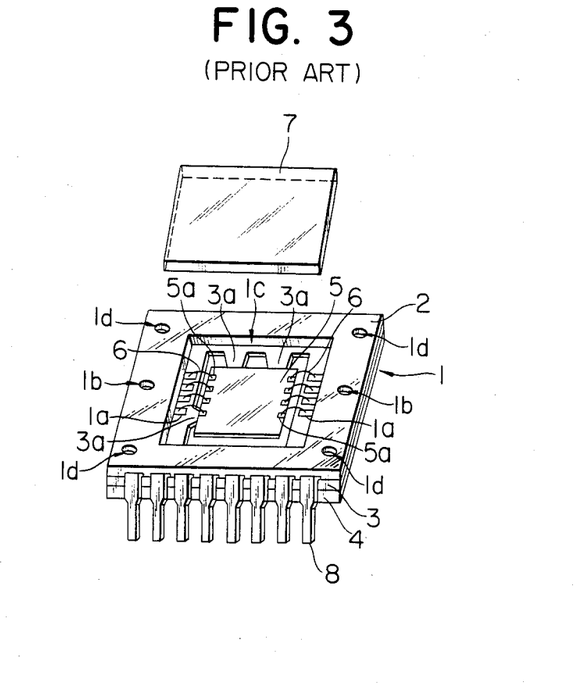
FIG. 3 is a partially disassembled perspective view of another conventional assembly.

FIG. 3 shows another conventional structure, in which the same components as those in FIGS. 1 and 2 are represented by the same numbers. In this structure, one of the multi-layered ceramic layers 2-4 constituting the support member 1 as explained in FIGS. 1 and 2, for example the ceramic layer 3 constituting a lateral wall of the chamber 1c, is provided, at the internal faces thereof, with plural projections 3a defining reference end faces for positioning the device. In the illustrated example there are provided two projections on an internal face and another projection on an adjacent internal face. At the fixation of the device 5 on the bottom of the chamber 1c, the device 5 is properly positioned in said chamber 1c by contacting the reference end faces of the device 5 with the front ends of said projections 3a having reference end faces.

Such conventional structure is however associated with the drawbacks explained in the foregoing under item C.

In the following there will be given an explanation of an embodiment of the present invention capable of completely avoiding the above-mentioned drawbacks of the conventional structures.

Figure 4:
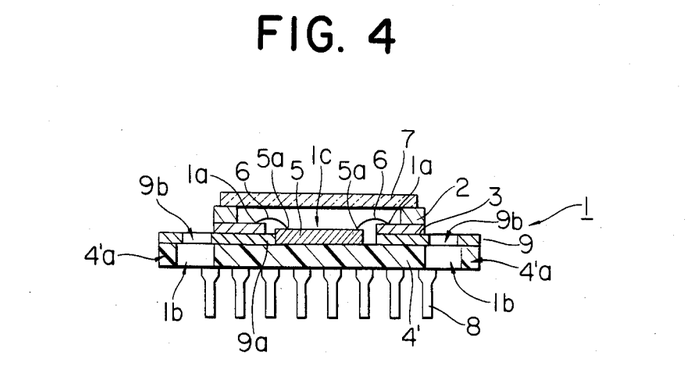
FIG. 4 is a cross-sectional view of an embodiment of the present invention.
Figure 5:
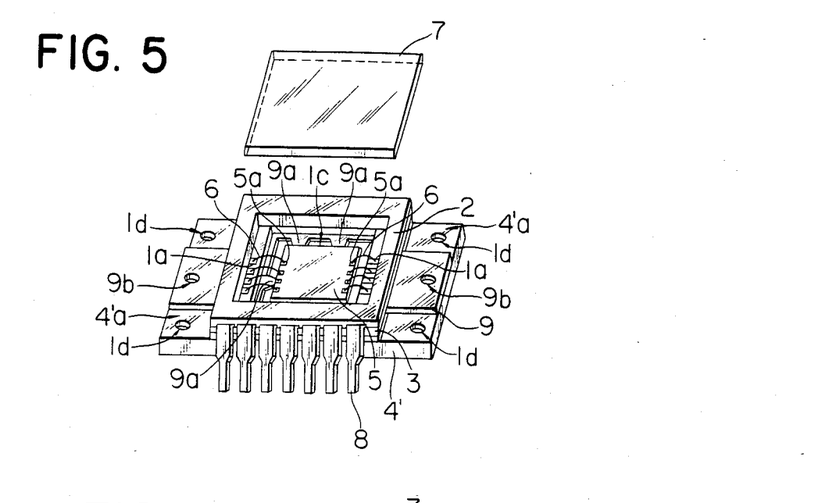
FIG. 5 is a partially disassembled perspective view of the assembly shown in FIG. 4.
Figure 6:
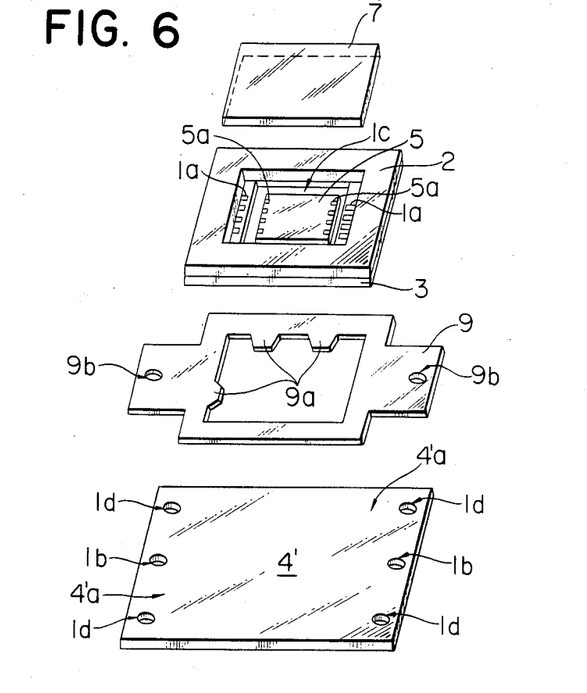
FIG. 6 is an exploded perspective view of the assembly shown in FIGS. 4 and 5.

Now reference is made to FIGS. 4, 5 and 6, showing an embodiment of the present invention, wherein the same components as those shown in FIGS. 1 to 3 are represented by the same numbers, and those of equivalent functions are represented by primed numbers. This embodiment is different from the conventional structure shown in FIGS. 1 and 2 in that, between ceramic layers 3 and 4' constituting the support member 1 there is inserted a metal member, for example a metal plate 9, which is provided, as detailedly shown in FIGS. 5 and 6, with a central aperture for accommodating the solid-state imaging device 5 therein. Said aperture is provided, on lateral faces thereof, with plural projections 9a having reference end faces. In the illustrated example there are provided two projections on a lateral face and another projection on an adjacent face. Also in exact positional relationship to the reference faces of said projections 9a there are formed positioning holes 9b to be utilized as a reference in mounting the device assembly on an apparatus. Said metal plate 9 is composed of a material of substantially the same thermal expansion coefficient as that of the ceramic material, for example Kovar. Said metal plate 9 can be prepared by punching from a metal sheet and is therefore inexpensive and suitable for mass production. Also the dimensional precision is sufficiently assured since the projections 9a and positioning holes 9b can be formed simultaneously at the punching.

The ceramic layers 2, 3 are punched and subjected to electrode formation in the state of so-called green sheets, and are sintered after lamination to obtain a ceramic frame. Also the ceramic layer 4' is larger than said ceramic layers 2, 3 but is prepared in a similar manner. Said ceramic frame (2,3), metal plate 9 and ceramic plate 4' can be bonded together by already known methods such as soldering by metallizing, sealing with a low-melting glass or sealing with an epoxy resin, and a satisfactorily reliable solid-state imaging device assembly can be obtained in this manner.

In such assembly structure, a precise positional relationship between the positioning holes 9b and the solid-state imaging device 5 can be assured by merely maintaining the reference end faces of the imaging device 5 in contact with the reference end faces of the projections 9a in the aperture of the metal plate 9.

Holes 1b in marginal areas 4'a of the ceramic plate 4' are formed corresponding to but somewhat larger than the positioning holes 9b of the metal plate 9. In said marginal areas 4'a there are also formed mounting holes 1d.

Figure 7:
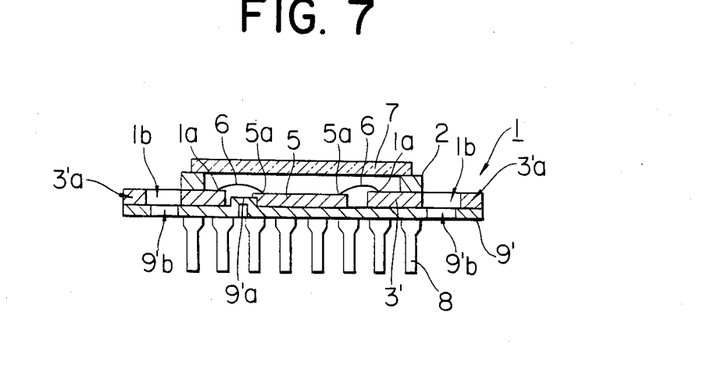
FIG. 7 is a cross-sectional view of another embodiment of the present invention.
Figure 8:
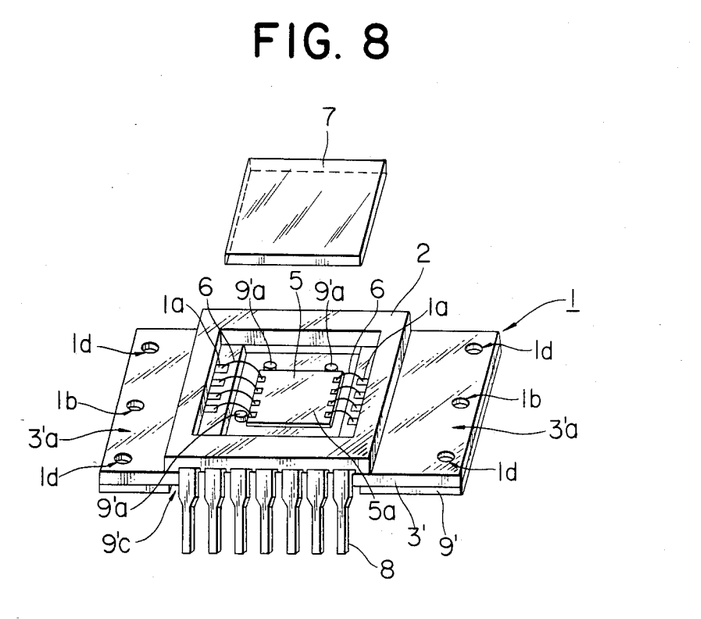
FIG. 8 is a partially disassembled perspective view of the assembly shown in FIG. 7.
Figure 9:
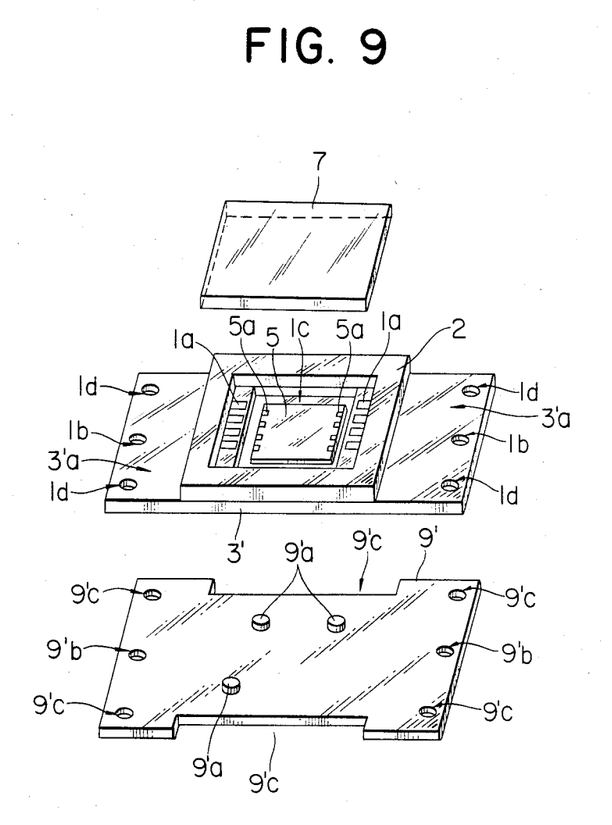
FIG. 9 is an exploded perspective view of the assembly shown in FIGS. 7 and 8.

Now reference is made to FIGS. 7, 8 and 9 showing another embodiment of the present invention, the same components as those shown in FIGS. 1 to 6 are represented by the same numbers, and those of equivalent functions are represented by primed numbers. In this embodiment the position-defining means for the solid-state imaging device 5 are composed of half-punched pins 9'a formed on a metal plate 9' composed for example of Kovar.

Also in this embodiment said half-punched pins 9'a, positioning holes 9'b and mounting holes 9'c can be simultaneously formed on the metal plate 9' to ensure satisfactory positional precision, in an inexpensive manner suitable for mass production.

In the present embodiment the metal plate 9' is not provided with the aperture, and the solid-state imaging device 5 is positioned by the pins 9'a at the mounting on the metal plate 9'. Naturally an insulating layer is formed on the metal plate 9', at least in a part thereof supporting the device 5. Since the device 5 is supported by the plate 9' in this embodiment, the ceramic plate 4 in the foregoing embodiments can be dispensed with and the ceramic plate 3' constituting the ceramic frame (2,3') is provided with marginal areas 3'a in which are formed holes 1b corresponding to but slightly larger than the positioning holes 9'b of the plate 9' and other holes 1d corresponding to the mounting holes 9'c. Furthermore, as shown in FIGS. 8 and 9, the plate 9' is provided with recesses 9'c for avoiding contact with the terminal leads 8.

Figure 10:
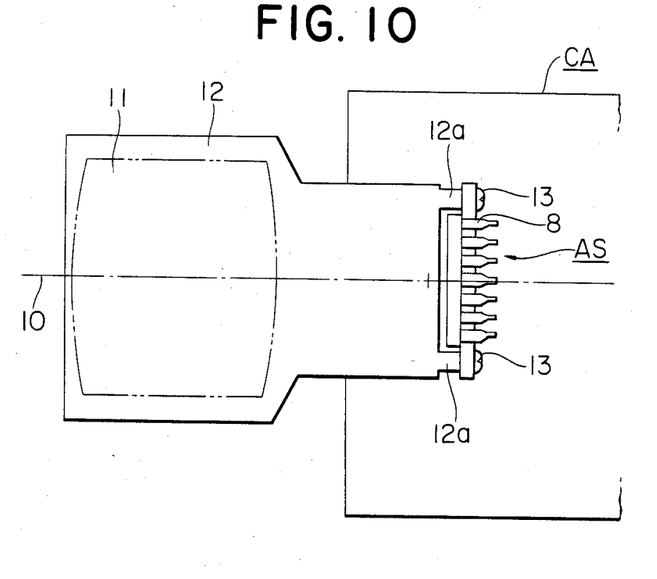
FIG. 10 is a schematic view showing the mode of mounting of the solid-state imaging device assembly to a lens tube.
Figure 11:
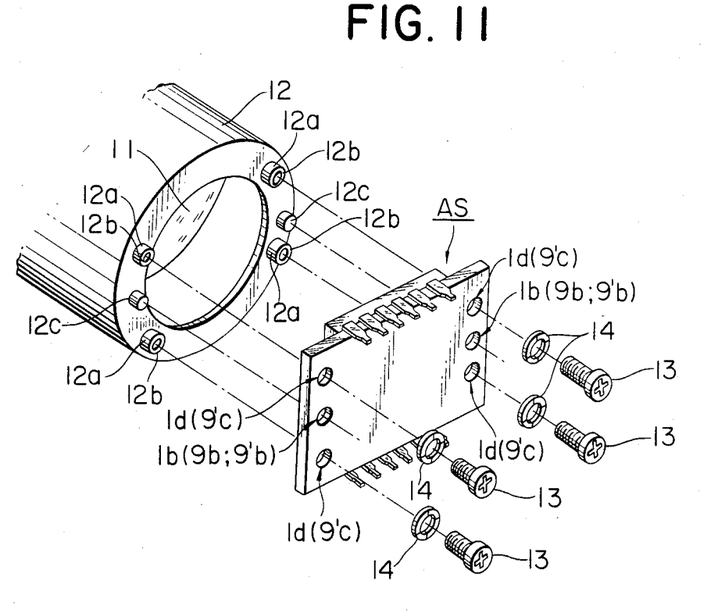
FIG. 11 is an exploded perspective view of a main part of the structure shown in FIG. 10.

The solid-state imaging device assembly of the above-described structures can be mounted for example on a lens tube structure in a manner as shown in FIGS. 10 and 11. In FIG. 10, a fixed lens tube 12 housing a group of lenses 11 (indicated collectively in FIG. 10 by the chain-line outline) therein and fixed on a camera body CA is provided with mounting seats 12a for mounting the solid-state imaging device assembly AS for example in four places, and said assembly AS is fixed to the lens tube 12 by means of the mounting holes 1d of the support member 1 and fixing members 13 such as screws.

In FIG. 11 there are shown four mounting seats 12a mentioned above, with faces 12b thereof directed to the support member 1. Said faces 12b are for example formed by plastic molding in such a manner as to define a plane perpendicular to the lens axis 10 with such a precision as not to cause uneven focusing in the image. The precision of the perpendicular plane can be further improved in the case that the components are formed by aluminum die casting, since said mounting faces 12b can be finished at the precise finishing, for example, of the internal face of the lens tube with a lathe. The device assembly AS is provided, in the support member 1 thereof, with mounting holes 1d (9'c) respectively corresponding to the mounting seats 12a. The lens tube 12 is further provided with positioning pins 12c, which engage with the positioning holes 9b, 9b' provided on the metal plate 9, 9' of the assembly AS and which are precisely positioned to the optical axis 10. Therefore the solid-state imaging device assembly AS can be mounted on the lens tube 12 by engaging the positioning pins 12c of the lens tube 12 with the positioning holes 1b (9b; 9b') of the assembly AS thereby aligning the mounting holes 1d (9'c) with the mounting seats 12a and fitting the screws 13 with washers 14 into the mounting holes 1d (9'c).

In this manner the device 5 is precisely centered on the optical axis 10 by the mutual engagement of the pins 12c and the holes 1b (9b; 9'b) and the perpendicularity between the optical axis 10 and the imaging face of the imaging device can be assured by maintaining the precision of the plane defined by the faces 12b of the mounting seats 12.

As explained in the foregoing, the solid-state imaging device assembly of the present invention allows one to precisely devise the positional relationship between the solid-state imaging device and the mounting means provided in the support member for said device, and enables one to ensure satisfactory positional precision between the lens axis and the imaging face of the solid-state imaging device without the use of any adjusting mechanism at the mounting of said assembly on a camera body or a lens tube. Also the positioning means on the assembly is made of a metal member to ensure a satisfactory fitting precision at the mounting on the camera body or the lens tube.

In the foregoing embodiments the positioning means provided on the metal plate is composed of positioning holes (9b; 9'b), but said means can also be composed of protruding pins for achieving same effect.

What is claimed is:

1. A solid-state image pick-up device assembly comprising:
   (a) a solid-state image pick-up device;
   (b) a metal member provided with first position defining means for defining a first position of said slid-state image pick-up device and second position defining means for defining a second position of said assembly on an instrument utilizing said assembly, said second position defining means having a predetermined fixed relation to said first position; and
   (c) an insulating frame for sealing said solid-state image pick-up device together with said metal member.

2. A solid-state image pick-up device assembly according to claim 1, wherein said metal member is further provided with an aperture for accommodating said solid-state image pick-up device, and said first position defining means is provided in a part of said aperture.

3. A solid-state image pick-up device assembly according to claim 2, wherein said metal member is of a plate form and said first position defining means includes plural portions projecting in said aperture.

4. A solid-state image pick-up device assembly according to claim 1, wherein said metal member is further provided with an area for placing said solid-state image pick-up device thereon, and said first position defining means is provided in the vicinity of said area.

5. A solid-state image pick-up device assembly according to claim 4, wherein said metal member is of a plate form, and said first position defining means includes plural projections formed perpendicularly to the plane of said plate-formed metal member.

6. A solid-state image pick-up device assembly according to any one of claims 1 or 5, wherein said insulating frame includes a ceramic member, and said metal member is provided with a thermal expansion coefficient similar to that of said ceramic member.

7. A solid-state image pick-up device assembly according to claim 6, wherein said metal member is composed of Kovar.

8. A lens assembly comprising:
   (a) lens means;
   (b) fixed lens barrel means housing said lens means and having first position defining means; and
   (c) a solid-state image pick-up device unit attached to a portion of said lens barrel means, said unit comprising:
      (c 1) a solid state image pick-up device for receiving light passed through said lens means;
      (c 2) a metal member having second position defining means for defining a second position of said solid-state image pick-up device and third position defining means for defining a third position of said unit with respect to said lens barrel means in cooperation with said first position defining means, said third position defining means having a predetermined fixed relation to said second position; and
      (c 3) an insulating frame for sealing said solid-state image pick-up device together with said metal member.

9. A camera comprising:
   (a) a camera body;
   (b) lens means;
   (c) fixed lens barrel means housing said lens means and fixed on said camera body, said lens barrel means having first position defining means; and
   (d) a solid-state image pick-up device unit attached to a portion of said lens barrel means, said unit comprising:
      (d1) a solid-state image pick-up device for receiving light passing through said lens means;
      (d2) a metal member having second position defining means for defining a second position of said solid-state image pick-up device and third position defining means for defining a third position of said unit with respect to said lens barrel means in cooperation with said first position defining means of said fixed lens barrel means, said third position defining means having a fixed relation to said second position; and
      (d3) an insulating frame for sealing said solid-state image pick-up device together with said metal member.

10. An optical instrument comprising:
(a) lens means defining an optical axis;
(b) first position defining means arranged in a predetermined relation with respect to said optical axis; and
(c) a solid-state image pick-up device assembly, including:
(c 1) a solid-state image pick-up device for picking up an image formed by said lens means;
(c 2) a metal member having second position defining means for positioning said solid-state image pick-up device and third position defining means for positioning said assembly with respect to said optical axis in cooperation with said first position defining means; and
(c 3) sealing means for sealing said solid-state image pick-up device together with said metal member.

11. An optical instrument according to claim 10, wherein said sealing means includes an insulating frame for sealing said solid-state image pick-up device together with said metal member.

12. An integrated semiconductor chip package comprising:
(a) an integrated semiconductor chip;
(b) a metal member having first position defining means for defining a first position of said semiconductor chip and second position defining means for defining a second position of said package on an instrument utilizing said package, said second defining means position having a predetermined fixed relation to said first position; and
(c) insulating means for sealing said semiconductor chip together with said metal member.

13. An integrated semiconductor chip package according to claim 12, wherein said metal member further has an aperture for accommodating said semiconductor chip, and said first position defining means is provided in a part of said aperture.

14. An integrated semiconductor chip package according to claim 13, wherein said metal member is of a plate form, and said first position defining means comprises plural portions projecting in said aperture.

15. An integrated semiconductor chip package according to claim 12, wherein said metal member further has an area for placing said semiconductor chip thereon, and said first position defining means is provided in the vicinity of said area.

16. An integrated semiconductor chip package according to claim 15, wherein said metal member is of a plate form, and said first position defining means includes plural projections formed perpendicularly to the plane of said plate-formed metal member.

17. An integrated semiconductor chip package according to any one of claims 12 to 16, wherein said insulating means includes a ceramic member, and said metal member is provided with a thermal expansion coefficient similar to that of said ceramic member.

18. An integrated semiconductor chip package according to claim 17, wherein said metal member is composed of Kovar.

19. A structure for attaching an integrated semiconductor chip assembly including an integrated semiconductor chip to an instrument utilizing the semiconductor chip assembly, said structure comprising in combination:
(a) first position defining means arranged at a predetermined position on the instrument; and
(b) a metal member having second position defining means for defining a second position of said semiconductor chip and third position defining means for defining a third position of said assembly with respect to the instrument in cooperation with said first position defining means, said third position defining means having a predetermined relation to said second position.

* * * * *

UNITED STATES PATENT AND TRADEMARK OFFICE
CERTIFICATE OF CORRECTION

PATENT NO. : 4,594,613
DATED : June 10, 1986
INVENTOR(S) : KENICHI SHINBORI, ET AL.

It is certified that error appears in the above-identified patent and that said Letters Patent is hereby corrected as shown below:

Column 4, line 29, change "invention, the" to --invention, wherein the--.

Column 5, line 56, change "slid-" to --solid- --.

Column 6, line 18, change "1 or 5," to --1 to 5,--.

Column 6, line 32, change "solid state" to --solid-state--.

Column 7, lines 29-30, change "second de- fining means position" to --second position defining means--.

Signed and Sealed this

Twenty-seventh Day of January, 1987

Attest:

DONALD J. QUIGG

Attesting Officer     Commissioner of Patents and Trademarks